(12) United States Patent
Eom et al.

(10) Patent No.: US 9,355,591 B2
(45) Date of Patent: May 31, 2016

(54) ORGANIC LIGHT EMITTING DIODE DISPLAY AND METHOD FOR COMPENSATING FOR DEGRADATION OF PIXEL LUMINANCE

(71) Applicant: Samsung Display Co., Ltd., Yongin, Gyeonggi-Do (KR)

(72) Inventors: Ji-Hye Eom, Yongin (KR); Baek-Woon Lee, Yongin (KR); In-Hwan Ji, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 50 days.

(21) Appl. No.: 14/266,740

(22) Filed: Apr. 30, 2014

(65) Prior Publication Data

US 2014/0320553 A1   Oct. 30, 2014

(30) Foreign Application Priority Data

Apr. 30, 2013 (KR) .................. 10-2013-0048745
Feb. 26, 2014 (KR) .................. 10-2014-0022874

(51) Int. Cl.
*G09G 3/32* (2006.01)
*G09G 3/3208* (2016.01)
*H01L 27/32* (2006.01)

(52) U.S. Cl.
CPC ...... *G09G 3/3208* (2013.01); *G09G 2320/0233* (2013.01); *G09G 2320/043* (2013.01); *G09G 2330/10* (2013.01); *G09G 2360/145* (2013.01); *H01L 27/3269* (2013.01)

(58) Field of Classification Search
CPC .......... G09G 2320/043; G09G 3/3233; G09G 2320/029; G09G 2320/045; G09G 2320/0295; G09G 2320/0233; G09G 3/3208; G09G 2320/0693; G09G 3/006
USPC ......................................................... 345/690
See application file for complete search history.

(56) References Cited

U.S. PATENT DOCUMENTS

| 2004/0263444 | A1* | 12/2004 | Kimura ........................... 345/82 |
| 2010/0165232 | A1* | 7/2010 | Park et al. ....................... 349/58 |
| 2011/0242074 | A1* | 10/2011 | Bert et al. ..................... 345/207 |
| 2014/0055715 | A1* | 2/2014 | Lee et al. ......................... 349/62 |

FOREIGN PATENT DOCUMENTS

| KR | 10-2001-0045248 A | 6/2001 |
| KR | 10-2009-0130747 A | 12/2009 |
| KR | 10-2010-0008707 A | 1/2010 |
| KR | 10-20100012247 A | 2/2010 |
| KR | 10-2011-0032937 A | 3/2011 |

* cited by examiner

*Primary Examiner* — Temesgh Ghebretinsae
*Assistant Examiner* — Lisa Landis
(74) *Attorney, Agent, or Firm* — Knobbe, Martens, Olson & Bear, LLP

(57) ABSTRACT

An organic light emitting diode (OLED) display and a method of compensating for degradation are disclosed. One inventive aspect includes a panel assembly including a plurality of pixels. Luminance measuring units are formed along a perimeter of the panel assembly to measure luminance of light emitted from the pixels. A processing unit compares the measured luminance data so as to detect and also compensate for a degraded pixel.

22 Claims, 11 Drawing Sheets

ORGANIC LIGHT EMITTING DIODE DISPLAY AND METHOD FOR COMPENSATING FOR DEGRADATION OF PIXEL LUMINANCE

CROSS-REFERENCE TO RELATED APPLICATIONS

This application claims priority to and the benefit of Korean Patent Application No. 10-2013-0048745 filed on Apr. 30, 2013 and No. 10-2014-0022874 filed on Feb. 26, 2014 in the Korean Intellectual Property Office, the entire contents of which are incorporated herein by reference.

BACKGROUND

1. Field

The disclosed technology relates to an organic light emitting diode (OLED) display, and in particular, a method of compensating for degradation of pixel luminance.

2. Description of the Related Technology

An organic light emitting diode (OLED) is a light emitting device which has advantages of wide viewing angle, superior contrast ratio, fast response time, superior luminance, low driving voltage, fast response time. In display panel including a matrix of pixel OLEDs, some pixels may be degraded over time.

One recognized method of compensating for a degraded pixel is as follows. Light data are acquired from a dummy pixel that is formed in the display panel. Further, calculating the total light emitting time of each pixel can be used to determine the degree of degradation. Finally, image data can be scaled to enhance luminance in the degraded and/or neighboring pixels.

To precisely measure degradation data of a dummy pixel, it is driven in a same condition as a normal pixel in an active display region. As such, variation of data for maintaining constant luminance is measured and degradation is compensated using the measured variation of the data.

However, where process variations occur between organic light emitting display panels or inside an organic light emitting display panel and when the life-span characteristic of a dummy pixel is different than a pixel within an active area, compensation will vary according to the degree of degradation. Further, when operational conditions local to the dummy pixel are different from such conditions in the active area, degradation compensation may be insufficient and may need to increase.

The above information disclosed in this Background section is only for enhancement of understanding of the background of the disclosed technology and therefore it may contain information that does not form the prior art that is already known in this country to a person of ordinary skill in the art.

SUMMARY OF CERTAIN INVENTIVE ASPECTS

The disclosed technology has been made in an effort to provide an OLED display and a method of compensating for degradation having advantages of improving compensation of a degraded pixel.

An exemplary embodiment of the disclosed technology provides an organic light emitting diode display including, a panel assembly including a plurality of pixels, a plurality of luminance measuring units formed along a perimeter surface of the panel assembly and configured to measure luminance of light emitted from the pixels, and a processing unit configured to compare a luminance data with each other, to detect a degraded pixel from the pixels and to compensate the degraded pixel. The luminance data are measured by the luminance measuring units.

In another exemplary embodiment of the organic light emitting diode display, the luminance measuring units include at least one photo sensor.

In another exemplary embodiment of the organic light emitting diode display, the luminance measuring units are formed in a predetermined interval.

In another exemplary embodiment of the organic light emitting diode display, the processing unit includes: a current measuring unit, a degradation determinator, and a controller. The current measuring unit is configured to measure a current applied to the panel assembly. The degradation determinator is configured to determine whether a pixel is degraded by comparing the current measured by the current measuring unit with the current luminance data measured by the luminance measuring units. The controller is configured to control the degraded pixel to emit light as a normal pixel.

In another exemplary embodiment of the organic light emitting diode display, the processing unit further includes a pixel position calculator. The pixel position calculator calculates a position of a degraded pixel from at least the position of a luminance measuring unit. The luminance measuring unit measures luminance data having a relatively low value from the luminance data measured by the luminance measuring units in a state in which a same current is applied to the panel assembly.

In another exemplary embodiment of the organic light emitting diode display, the processing unit is further configured to compensate the degraded pixel by multiplying at least one of a red pixel, a green pixel and a blue pixel by a scale factor.

In another exemplary embodiment of the organic light emitting diode display, at least one portion of the panel assembly is further configured to display a predetermined pattern.

Another embodiment of the disclosed technology provides an organic light emitting diode display including a panel assembly including a display area on which a plurality of pixels are formed and a non-display area on which a pixel is not formed, a diffused reflection unit a plurality of luminance measuring units formed on a bottom surface of the panel assembly and a processing unit configured to detect and compensate a degraded pixel using luminance data and an operation current for driving the panel assembly. The diffused reflection unit is formed in the non-display area of the panel assembly to diffuse a light emitted from the display area. The luminance measuring units are configured to measure luminance data of the diffused light from the diffused reflection unit. In another exemplary embodiment of the organic light emitting diode display, the diffused reflection unit is formed on a top surface of the panel assembly.

In another exemplary embodiment of the organic light emitting diode display, the organic light emitting diode display further includes a refraction unit formed between the diffused reflection unit and the panel assembly.

In another exemplary embodiment of the organic light emitting diode display, a top surface of the panel assembly is partially retracted and the diffused reflection unit is received in a retracted region of the panel assembly.

In another exemplary embodiment of the organic light emitting diode display, a thickness of the diffused reflection unit is same as a depth retracted in the panel assembly.

In another exemplary embodiment of the organic light emitting diode display, the diffused reflection unit has a line shape.

In another exemplary embodiment of the organic light emitting diode display, the diffused reflection unit includes unit diffused reflection parts formed in a predetermined interval.

In another exemplary embodiment of the organic light emitting diode display, the luminance measuring units includes a photo sensor.

In another exemplary embodiment of the organic light emitting diode display, the luminance measuring units are formed in a predetermined interval.

In another exemplary embodiment of the organic light emitting diode display, the luminance measuring units face the diffused reflection unit.

In another exemplary embodiment of the organic light emitting diode display, the processing unit includes: a current measuring unit, a degradation determinator, and a controller. The current measuring unit is configured to measure a current applied to the panel assembly. The degradation determinator is configured to determine whether a pixel is degraded by comparing the current measured by the current measuring unit with the current luminance data measured by the luminance measuring units. The controller is configured to control the degraded pixel to emit light as a normal pixel.

In another exemplary embodiment of the organic light emitting diode display, the processing unit further includes a pixel position calculator. The pixel position calculator calculates a position of a degraded pixel from the position of a luminance measuring unit. The luminance measuring unit measures luminance data having a relatively low value from the luminance data among the luminance measuring units in a state, in which a same current is applied to the panel assembly.

In another exemplary embodiment of the organic light emitting diode display, the organic light emitting diode display further includes a light blocking unit formed on the diffused reflection unit in the non-display area of the panel assembly.

In another exemplary embodiment of the organic light emitting diode display, the light blocking unit comprises a black polarizing film.

In another exemplary embodiment of the organic light emitting diode display, at least one portion of the panel assembly is further configured to display a predetermined pattern.

In another exemplary embodiment of the organic light emitting diode display, the processing unit is further configured to compensate the degraded pixel by multiplying the luminance data by a scale factor for at least one subpixel.

Yet another embodiment of the disclosed technology provides a method of compensating a degraded pixel of an organic light emitting diode display. One inventive aspect of the method includes: acquiring luminance data from a panel assembly of the organic light emitting diode display, determining whether a pixel of the panel assembly is degraded based on the acquired luminance data, and compensating a degraded pixel when there is the degraded pixel.

In another exemplary embodiment of the method, acquiring of the luminance data from a panel assembly can include acquiring the luminance data by measuring luminance of light emitted from respective pixels of the panel assembly by a plurality of luminance measuring units.

In another exemplary embodiment of the method, determining whether a pixel of the panel assembly is degraded can include determining whether low-value luminance data are included in the luminance data.

Another exemplary embodiment of the method can further include calculating a position of the degraded pixel from the acquired luminance data before compensating for the degraded pixel after determining whether the pixel is degraded.

In another exemplary embodiment of the method, calculating of the position of the degraded pixel includes calculating the position of the degraded pixel from a position of one or more luminance measuring units of the organic light emitting diode display. The one or more luminance measuring units measure low-value luminance data when the current is applied to respective pixels of the panel assembly.

In another exemplary embodiment of the method, compensating of the degraded pixel can include controlling a current of the degraded pixel so that the degraded pixel emits light as a normal pixel.

In another exemplary embodiment of the method, compensating of the degraded pixel can include controlling a full driving voltage ELVDD supplied to the pixel of the panel assembly.

In another exemplary embodiment of the method, compensating of the degraded pixel can include controlling a red driving voltage, a green driving voltage, and a blue driving voltage supplied to the pixel of the panel assembly, respectively.

The OLED display according to an exemplary embodiment of the disclosed technology, measures a luminance deteriorated degree based on the light emitted from an active pixel arranged on the display area to compensate for the degraded pixel. In this manner, the occurrence of the compensation error can be prevented by directly reflecting and compensating for an actual active pixel without using a dummy pixel.

DETAILED DESCRIPTION OF CERTAIN INVENTIVE EMBODIMENTS

Figure 1:
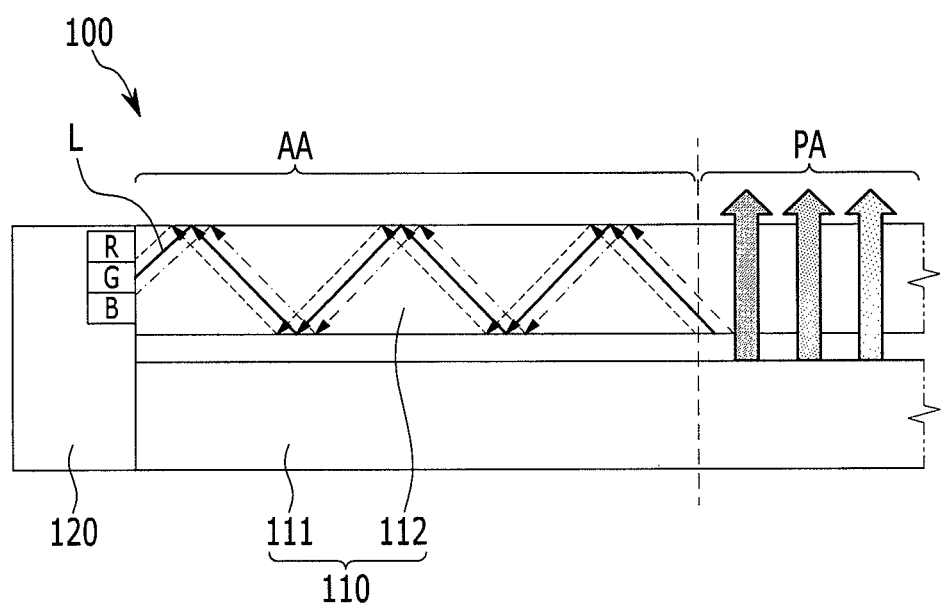
FIG. 1 is a cross-sectional view illustrating a part of an OLED display according to a first exemplary embodiment.

In the following detailed description, only certain exemplary embodiments of the disclosed technology have been shown and described, simply by way of illustration. As those skilled in the art would realize, the described embodiments may be modified in various different ways, all without departing from the spirit or scope of the disclosed technology.

Further, in various exemplary embodiments, the same constituent elements will be assigned with the same reference numerals and will be described in only the first exemplary embodiment. Only constituent elements of another exemplary embodiment different from those of the first exemplary embodiment will be described.

Accordingly, the drawings and description are to be regarded as illustrative in nature and not restrictive. Like reference numerals designate like elements throughout the specification.

Further, since sizes and thicknesses of constituent members shown in the accompanying drawings are arbitrarily given for better understanding and ease of description, the disclosed technology is not limited to the illustrated sizes and thicknesses.

In the drawings, the thickness of layers, films, panels, regions, etc., are exaggerated for clarity. In the drawings, for better understanding and ease of description, the thicknesses of some layers and areas are exaggerated. It will be understood that when an element such as a layer, film, region, or substrate is referred to as being "on" another element, it may be directly on the other element or intervening elements may also be present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

Here, when a first element is described as being coupled to a second element, the first element may be not only directly coupled to the second element but may also be indirectly coupled to the second element via a third element. Further, some of the elements that are not essential to the complete understanding of the disclosed technology are omitted for clarity. Also, like reference numerals refer to like elements throughout.

In addition, in the accompanying drawings, an organic light emitting diode (OLED) display is illustrated as an active matrix (AM)-type OLED display in a 6Tr-1Cap structure in which six thin film transistors (TFTs) and one capacitor are formed in one pixel, but the disclosed technology is not limited thereto. Therefore, the OLED display may have various structures. For example, a plurality of TFTs and at least one capacitor may be provided in one pixel of the OLED display, and separate wires may be further provided in the OLED display. Here, the pixel refers to a minimum unit for displaying an image, and the OLED display displays an image by using a plurality of pixels.

Figure 2:
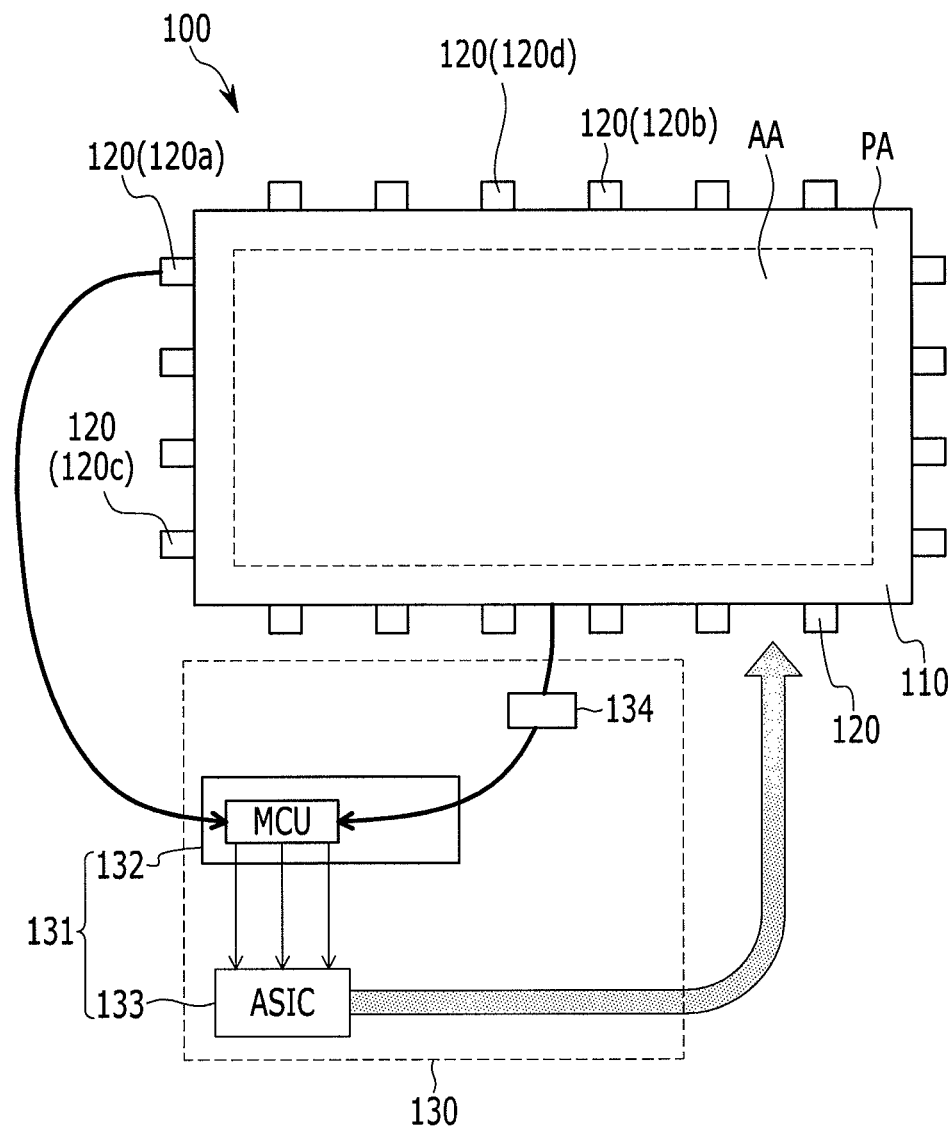
FIG. 2 is a plan view illustrating the OLED display according to a first exemplary embodiment shown in FIG. 1.

FIG. 1 is a cross-sectional view illustrating a part of an OLED display according to a first exemplary embodiment, and FIG. 2 is a plan view illustrating the OLED display according to the first exemplary embodiment shown in FIG. 1.

Referring to FIGS. 1 and 2, the OLED display 100 includes a panel assembly 110, at least one luminance measuring unit 120, and a processing unit 130.

An image is output to the panel assembly 110. The panel assembly 110 includes an upper substrate 112 and a lower substrate 111. The panel assembly 110 may include a plurality of pixels (not shown). The pixels may be arranged on the lower substrate 111, and the upper substrate 112 may seal the pixels. One pixel may be one organic light emitting element. In some implementations, the one pixel includes a plurality of organic light emitting elements. One or more organic light emitting elements may be patterned in the panel assembly 110.

A scan driver (not shown) for driving a plurality of pixels and a data driver (not shown) may be provided at the panel assembly 110. In addition, the panel assembly 110 may include pad electrodes (not shown) for transmitting an electrical signal to the scan driver and the data driver.

Meanwhile, although it has illustrated in FIG. 1 that light emitted from the organic light emitting element is irradiated upward of the panel assembly 110, the exemplary embodiment of the disclosed technology is not limited thereto. In addition, the light emitted from the organic light emitting element may be irradiated downward of the panel assembly 110.

The at least one luminance measuring unit 120 is formed along a perimeter surface of the panel assembly 110 to measure luminance of a light L emitted from the pixels. As a non-limiting example, when the panel assembly 110 has a rectangular shape, one or more luminance measuring units 120 may be formed at four edges, respectively.

The luminance measuring unit 120 may be positioned or adhere to the perimeter surface of the panel assembly 110. In one implementation, the luminance measuring unit 120 is spaced apart from the perimeter surface of the panel assembly 110 by at least one predetermined distance. When the luminance measuring unit 120 adheres to the perimeter surface of the panel assembly 110, it may be advantageous or easy to measure the luminance of the light L emitted from the pixels of the panel assembly 110 more precisely. In addition, the luminance measuring unit 120 may include a photo sensor.

A plurality of luminance measuring units 120 may be formed at every predetermined interval. In one implementation, the luminance measuring units 120 are formed at an irregular interval. However, when the luminance measuring units 120 are spaced apart from each other by a regular interval, it may be advantageous or easy to measure the luminance of the light L emitted from the pixel of the panel assembly 110 more precisely.

The processing unit 130 determines the degradation of a pixel is degraded by comparing the current data with the current luminance data. In one exemplary implementation, the processing unit 130 determines whether a pixel is degraded by comparing the current value measured by the current measuring unit 134 with the current luminance data measured by the luminance measuring units 120. In this case, the processing unit 130 can detect a degraded specific pixel from a plurality of pixels and/or determine a position of the degraded specific pixel. The current data may comprise at least a current value measured by the current measuring unit 134. The luminance data may comprise a luminance value of light generated from the pixel measured by the luminance measuring unit 120.

In one implementation, the processing unit 130 includes a current measuring unit 134, a pixel position calculator, and a controller 133. The processing unit 130 may further comprise a degradation determinator 132. The current measuring unit 134 measures a current applied to the panel assembly 110. In one implementation, the current measuring unit 134 measures a current flowing through each pixel of the panel assembly 110. A configuration of the current measuring unit 134 is not limited if the configuration measures a current flowing through a circuit. The degradation determinator 132 determines whether a plurality of pixels of the panel assembly 110 includes a degraded pixel by comparing luminance data and/or some other data. In one exemplary implementation, the degradation determinator 132 determines whether a pixel is degraded by comparing the current measured by the current measuring unit 134 with the current luminance data measured by the luminance measuring units 120.

According to one exemplary embodiment of the disclosed technology, the degradation determinator 132 includes a Micro Control Unit (MCU). The degradation determinator 132 may determine whether the luminance data measured by the luminance measuring units 120 include low-value luminance data.

In some implementations, the degradation determinator 132 determines whether a pixel is degraded at least partially based on current values measured by the current measuring unit 134. When low-value luminance data are included in the luminance data, the degradation determinator 132 may determine that the pixel is degraded. The degradation determinator 132 may confirm that the same current is supplied to the panel assembly 110 by the current measuring unit 134.

Further, when the pixel is degraded, the degradation determinator 132 may generate a control signal. The control signal may be capable of compensating the degradation at least partially based on the luminance data and/or the current data. In one exemplary implementation, the control signal includes compensation data created in the form of a frame scale factor. The created frame scale factor may be transferred to a controller 133 to be described later.

According to an exemplary embodiment of the disclosed technology, the controller 133 compensates a degraded pixel to emit light as a normal pixel based on the signal from the degradation determinator 132. The controller 133 may include Application Specific integrated Circuits (ASIC).

The controller 133 may compensate the degraded pixel by controlling the current to be supplied to the degraded specific pixel. The controller 133 may compensate the degraded pixel by increasing the current supplied to the degraded pixel. As a result, the degraded pixel emits light as a normal pixel.

In addition to compensating degraded pixels, the controller 133 may control a driving voltage ELVDD supplied to all pixels in the panel assembly 110. Since all the pixels in the panel assembly 110 may be degraded and in order to compensate the degraded pixels, the controller 133 may control the driving voltage ELVDD supplied to all the pixels.

The driving voltage ELVDD varies according to a red pixel, a green pixel, and a blue pixel. Accordingly, the controller 133 may differently control the driving voltage ELVDD to supply a red driving voltage, a green driving voltage, and/or a blue driving voltage to respectively pixels.

In some exemplary implementations, the degradation determinator 132 generates and transfers the control signal to the controller 133. In some other exemplary implementations, when controlling the driving voltage ELVDD, the degradation determinator 132 directly compensate the degradation without passing through the controller 133.

According to some exemplary embodiment of the disclosed technology, the processing unit 130 further includes a pixel position calculator to calculate a position of the degraded pixel. An example of a method of calculating the position of the degraded pixel by the pixel position calculator will be described. At first, a current is applied to the panel assembly 110. The same current may also be applied to all the pixels of the panel assembly 110. At this time, the pixel position calculator 131 calculates the position of the degraded pixel at least partially based on the position of the luminance measuring unit 120 and luminance data having a value relatively lower that other luminance data. The luminance data are measured by the luminance measuring units 120.

Meanwhile, an example of a method of calculating a position of a degraded pixel from the position of the luminance measuring unit 120 that measures luminance data having a relatively low value will be described.

In one implementation, it is confirmed that a value obtained by one luminance measuring unit 120b formed at a horizontal edge and a value obtained by one luminance measuring unit 120a formed at a vertical edge are relatively lower than values obtained by other luminance measuring units 120c and 120d. The pixel position calculator 131 may determine that a pixel (not shown) at a region where a cross between the two luminance measuring units 120a and 120b is a position of the degraded pixel and therefore indirectly measure the position of the degraded pixel. However, a method of calculating the position of the degraded pixel from positions of the luminance measuring units 120a and 120b that measures luminance data having at least one relatively low value is not limited to the above method.

Meanwhile, the disclosed technology is not limited to the processing unit 130 configured to calculate positions of the luminance measuring units to determine degraded degrees in every position and thereby to compensate the degraded pixel. The following is another method of compensating the pixel with the processing unit 130. In one implementation, a predetermined pattern is outputted (displayed) to a center or a whole of the panel assembly 110 and the luminance measuring unit 120 measures luminance and detects a degraded degree of the pixel. The processing unit 130 creates compensation data capable of compensating a degradation in the form of a frame scale factor.

In the next, a degraded pixel may be compensated by multiplying a red pixel, a green pixel, and a blue pixel with respect to compensation by a scale factor, respectively. The compensation data are inputted into the panel assembly 110. This scheme is generally used to compensate for the pixel, and thus a detailed description thereof is omitted.

Hereinafter, various embodiments of an OLED display 100 according to the disclosed technology will be described with reference to the accompanying drawings.

Figure 3:
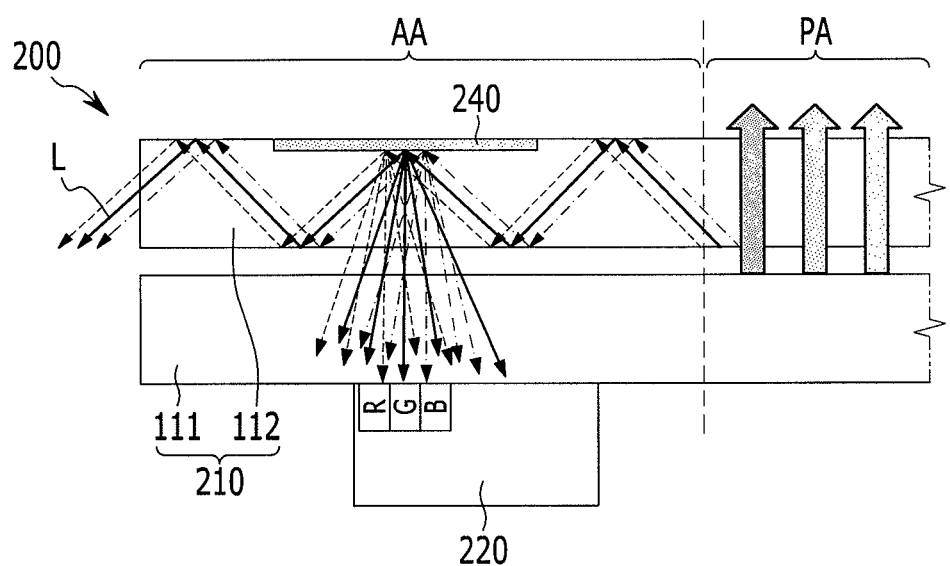
FIG. 3 is a cross-sectional view illustrating a part of an OLED display according to a second exemplary embodiment.

FIG. 3 is a cross-sectional view illustrating a part of an OLED display according to a second exemplary embodiment.

Referring to FIG. 3, the OLED display 200 according to the second exemplary embodiment includes a panel assembly 210, a diffused reflection unit 240, at least one luminance measuring unit 220, and a processing unit 130. The processing unit 130 has at least the same functions as those of the processing unit 130 of FIG. 2 according to the first exemplary embodiment, and thus the detailed description thereof is omitted.

The panel assembly 210 includes a display area AA and a non-display area PA. The display area AA is an area on which an image is displayed. The non-display area PA is an area on which the image is not displayed. The display area AA is provided therein with a plurality of pixels.

The diffused reflection unit 240 is formed on the non-display area PA to scatter-reflect the light L emitted from the display area AA. In one implementation, the diffused reflection unit 240 is formed at an upper portion of the non-display area PA in the panel assembly 210. The diffused reflection unit 240 is formed at an upper side of the non-display area PA in the panel assembly 210 for the purpose of scatter-reflecting the light L downward of the panel assembly 210. The light scatter-reflected by the diffused reflection unit 240 is irradiated to the luminance measuring unit 220.

More than one luminance measuring units 220 are formed at a bottom surface of the panel assembly 210 to measure luminance of the light L scatter-reflected by the diffused reflection unit 240. The luminance measuring units 220 may adhere to the bottom surface of the panel assembly 210.

Accordingly, most of the light L scatter-reflected by the diffused reflection unit 240 is incident to the luminance measuring unit 220 so that luminance measuring reliability can be improved.

In the OLED display 100 of FIG. 2 according to the first exemplary embodiment, the luminance measuring unit 120 of FIG. 2 is formed a perimeter surface of the panel assembly 110 of FIG. 2. However, in the OLED display 200 according to a second exemplary embodiment, the luminance measuring unit 220 is formed closely to a bottom surface of the panel assembly 210.

The luminance measuring unit 220 may face the diffused reflection unit 240. More particularly, the luminance measuring unit 220 may vertically face the diffused reflection unit 240 based on the panel assembly 210. By this arrangement, since most of the light L scatter-reflected by the diffused reflection unit 240 may be reflected to the luminance measuring unit 220, the luminance may be more exactly measured.

Although the luminance measuring unit 120 of FIG. 1 is formed on a perimeter surface of the panel assembly 210 of FIG. 1 in the OLED display 100 of FIG. 1 according to the first exemplary embodiment, the luminance measuring unit 220 is formed at a lower side of the panel assembly 210 in the OLED display 200 according to the second exemplary embodiment. By the arrangement, a space of the perimeter surface of the panel assembly 210 may be more efficiently used as compared with the OLED display 100 of FIG. 1 according to the first exemplary embodiment.

Meanwhile, a configuration of panel assembly 210 in the OLED display 200 according to the second exemplary embodiment will be described in detail. A top surface of the panel assembly 210 is partially retracted. Furthermore, the diffused reflection unit 240 may be positioned in a retracted region. That is, the diffused reflection unit 240 may be positioned inside the non-display area PA of the panel assembly 210.

In one implementation, a method of manufacturing the diffused reflection unit 240 may use a chemical scheme such as corrosion. Further, the diffused reflection unit 240 may be manufactured using a mechanical grinding tool such as a grinder. Further, the diffused reflection unit 240 may be manufactured by forming a micro pattern on the panel assembly 210 through a photolithography.

A thickness of the diffused reflection unit 240 may be the same as a retracted depth in the panel assembly 210. The above structure is a structure where the diffused reflection unit 240 does not protrude from a top surface of the panel assembly 210. Accordingly, the full thickness of the OLED display 100 may not increase.

Figure 4:
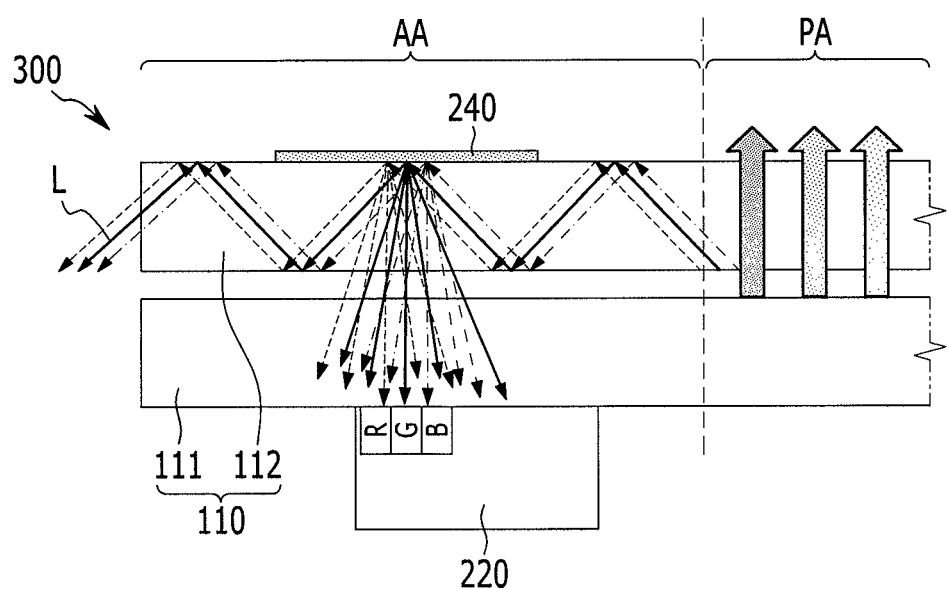
FIG. 4 is a cross-sectional view illustrating a part of an OLED display according to a third exemplary embodiment.

FIG. 4 is a cross-sectional view illustrating a part of an OLED display according to a third exemplary embodiment.

Unlike the OLED display 200 of FIG. 3 according to the second exemplary embodiment, referring to FIG. 4, a diffused reflection unit 240 may be formed on a top surface of the panel assembly 110 in the OLED display 300 according to the third exemplary embodiment. In one implementation, the diffused reflection unit 240 includes a diffused reflection film.

The diffused reflection film 240 may adhere by a separate adhesive (not shown). The adhesive may have the same refractive index as that of the upper substrate 112. For example, when the upper substrate 112 is made of glass, the adhesive may have the same refractive index as that of the glass.

In the above structure, although the panel assembly 110 is not separately processed, the diffused reflection unit 240 is formed on a top surface of an existing panel assembly so that the OLED display 300 may be manufactured. That is, a process of separately processing the panel assembly 110 is not performed to manufacture the OLED display 300 according to the third exemplary embodiment so that a manufacturing cost can be reduced.

Figure 5:
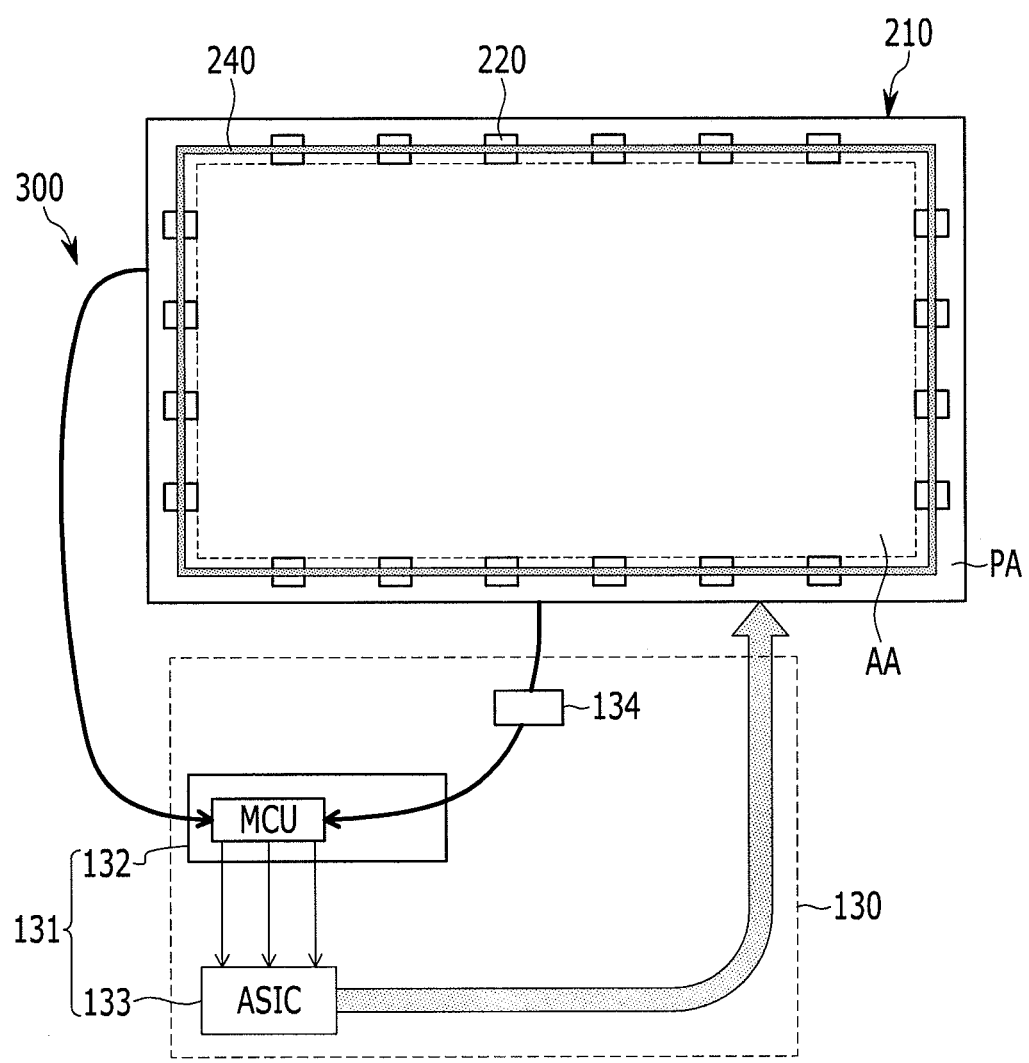
FIG. 5 is a plan view illustrating the OLED display according to a third exemplary embodiment shown in FIG. 4.

Meanwhile, as shown in FIG. 5, for example, the diffused reflection unit 240 may have a line shape. More particularly, the diffused reflection unit 240 may have a closed loop shape formed along the non-display area PA of the panel assembly 210.

Figure 6:
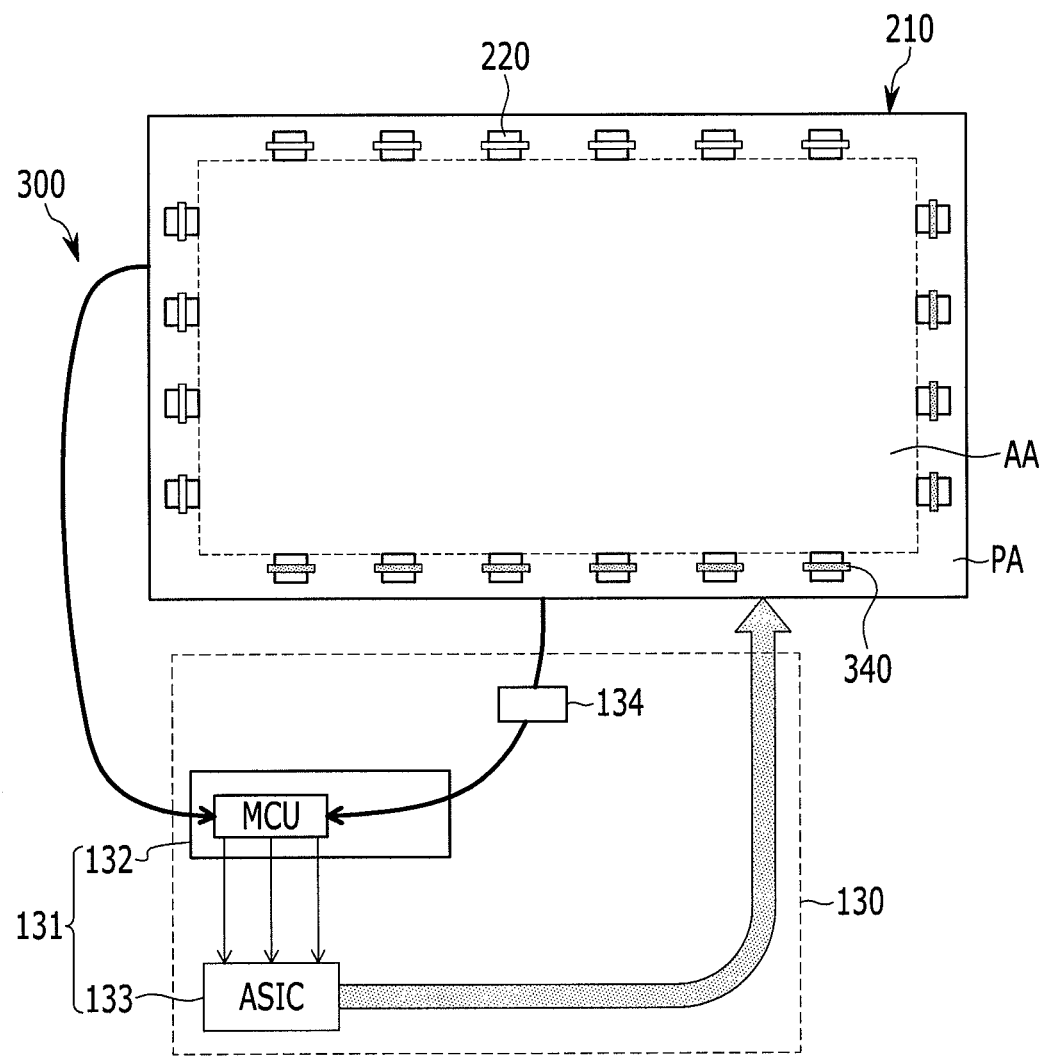
FIG. 6 is a plan view illustrating a modified example of a diffused reflection unit of an OLED display according to the third exemplary embodiment shown in FIG. 5.

In addition, as shown in FIG. 6, another implementation of the diffused reflection unit 240 of FIG. 5 includes unit diffused reflection units 340 that are formed at a predetermined interval. In some implementations, the unit diffused reflection parts 340 are formed only at a position corresponding to the luminance measuring unit 120 and the unit diffused reflection parts 340 are not formed at a position that does not correspond to the luminance measuring unit 120.

Further, although not shown, the diffused reflection unit 240 may have a line shape and be formed at a portion of the non-display area PA. The unit diffused reflection parts 340 may be formed at a remaining portion of the non-display area PA.

A shape of the diffused reflection unit 240 is not limited to the above shape. More particularly, a shape of the diffused reflection unit 240 is not specially limited if the shape of the diffused reflection unit 240 enables the light L emitted from the display area AA to be irradiated to the luminance measuring unit 220.

Figure 7:
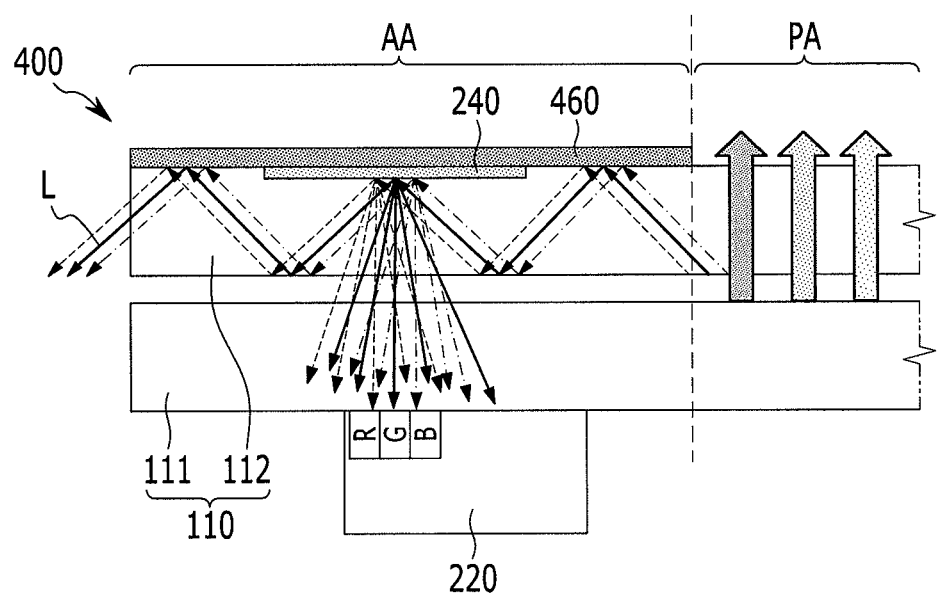
FIG. 7 is a cross-sectional view illustrating a part of an OLED display according to a fourth exemplary embodiment.
Figure 8:
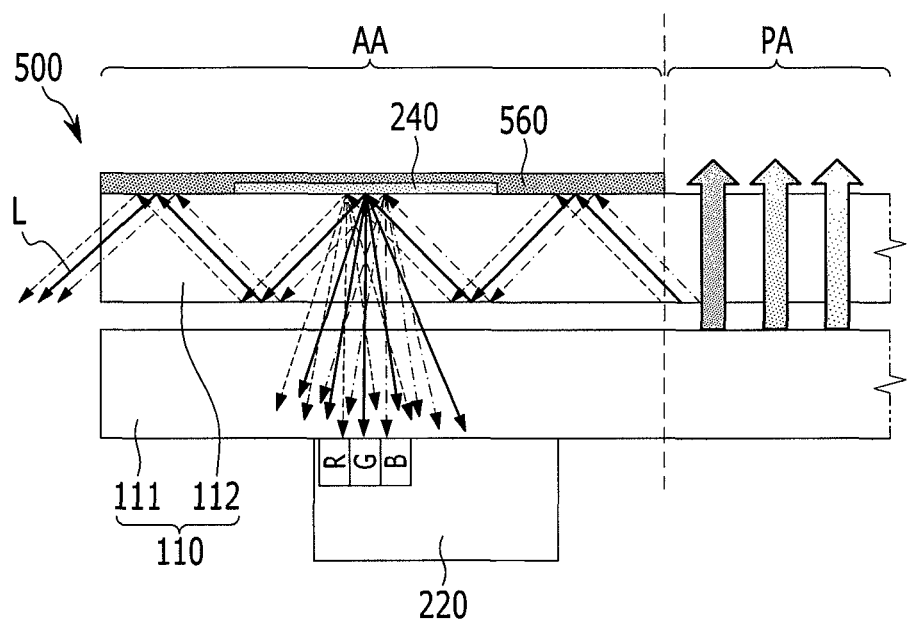
FIG. 8 is a cross-sectional view illustrating a part of an OLED display according to a fifth exemplary embodiment.

FIG. 7 is a cross-sectional view illustrating a part of an OLED display according to a fourth exemplary embodiment. FIG. 8 is a cross-sectional view illustrating a part of an OLED display according to a fifth exemplary embodiment.

At first, referring to FIG. 7, an OLED display 400 according to the fourth exemplary embodiment may include a light blocking unit 460. The light blocking unit 460 is formed on the diffused reflection unit 240 in a non-display area PA of the panel assembly 210. Unlike the OLED display 200 according to the second exemplary embodiment shown in FIG. 3, the light blocking unit 460 is formed in a non-display area of the panel assembly 210 in the OLED display 400 according to the fourth exemplary embodiment.

The light blocking unit 460 minimizes the light L scatter-reflected by the diffused reflection unit 240 from being reflected to the display area AA. Accordingly, the light blocking unit 460 may prevent luminance of the display area AA close to the scatter reflection unit 240 from varying due to mixing of reflected light L.

In the next, referring to FIG. 8, the OLED display 500 according to the fifth exemplary embodiment may include a light blocking unit 560 as well as the configuration of the OLED display 300 according to the third exemplary embodiment shown in FIG. 4.

In one implementation, the light blocking unit 560 includes a part making contact with the diffused reflection unit 240 which is retracted to have a predetermined depth. The diffused reflection unit 240 may be received in a retracted part of the light blocking unit 560 on a bottom surface of the light blocking unit 560. The light blocking unit 560 has been described previously, and thus a detailed description thereof is omitted.

Figure 9:
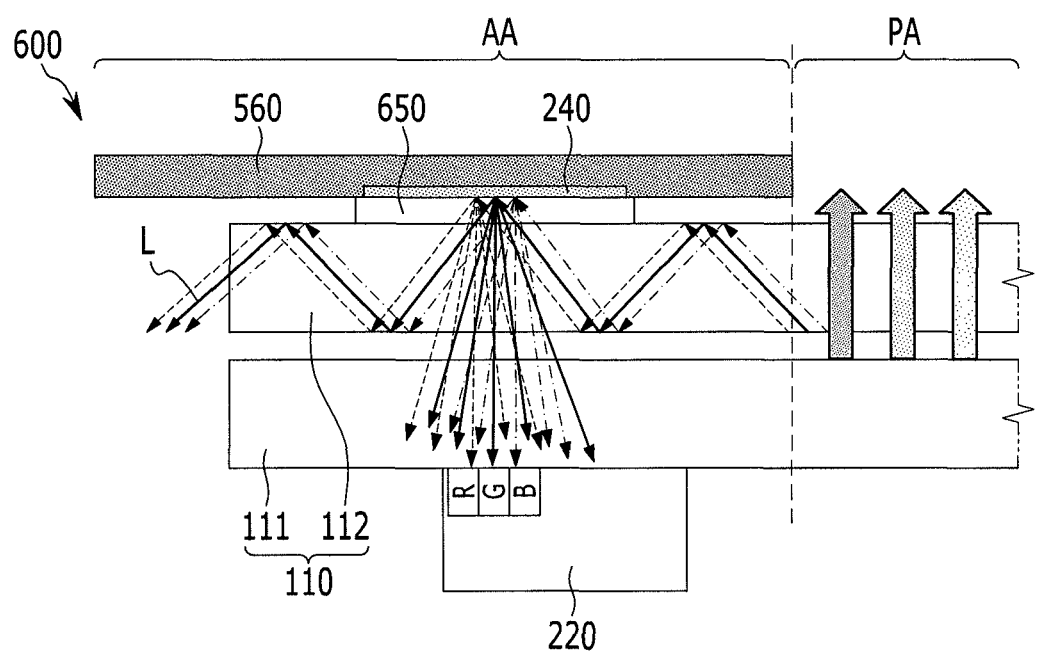
FIG. 9 is a cross-sectional view illustrating a part of an OLED display according to a sixth exemplary embodiment.
Figure 10:
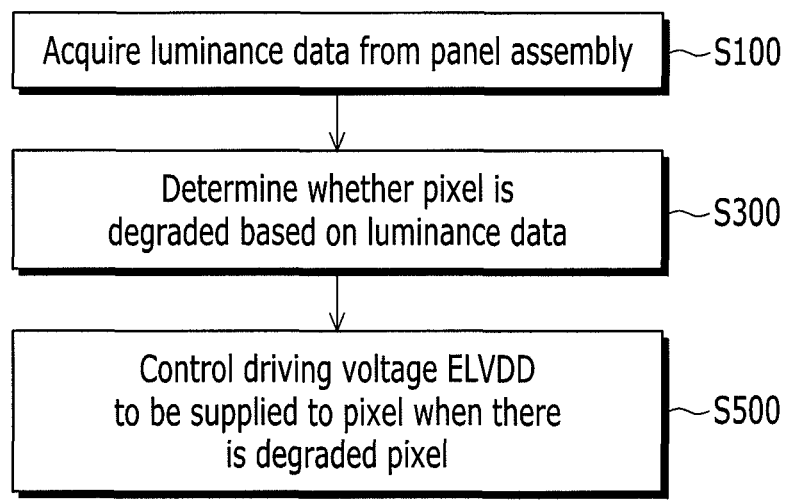
FIG. 10 is a flowchart illustrating a method of compensating for degradation according to an exemplary embodiment.
Figure 11:
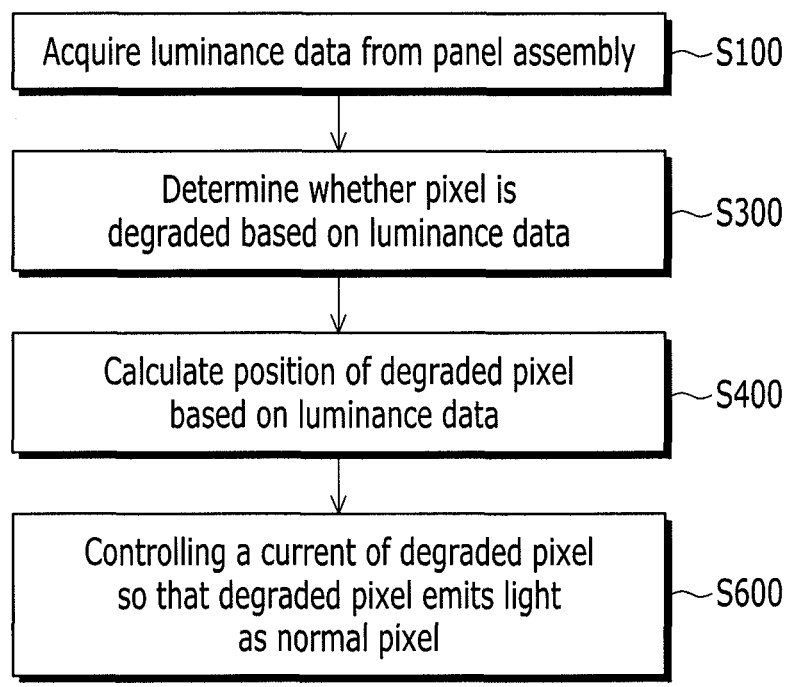
FIG. 11 is a flowchart illustrating a method of compensating for degradation according to another exemplary embodiment.

FIG. 9 is a cross-sectional view illustrating a part of an OLED display according to a sixth exemplary embodiment.

Referring to FIG. 9, the OLED display 600 according to the sixth exemplary embodiment may include a refracting unit 650.

The refracting unit 650 is interposed between the scattered reflecting unit 240 and the panel assembly 210. The refracting unit 650 may include a material having the same refractive index as a refractive index of glass constituting the panel assembly 210.

The OLED display 600 according to the sixth exemplary embodiment has a construction mentioned above includes the refracting unit 650 to scatter-reflect light L more than that in the OLED display 500 according to the fifth exemplary embodiment shown in FIG. 8 to the luminance measuring unit 220. Accordingly, the luminance measuring unit 220 measures luminance so that the luminance measuring reliability can be further improved.

As described above, in a case of a scheme of compensating for the degraded pixel in the OLED display according to the related art, if process variation occurs between panels or inside a panel, there is a difference between a degradation degree read in a dummy pixel and a degradation degree in an actual active pixel so that a compensation error inevitably occurs.

However, the OLED display according to various exemplary embodiments having a structure as described above measures a luminance deteriorated degree based on light emitted from an active pixel arranged on a display region to compensate for the degraded pixel. In this manner, an occurrence of a compensation error may be prevented by directly reflecting and compensating for an actual active pixel without using a dummy pixel.

A method of compensating for a degraded pixel in an OLED display having a construction described above will be described.

The method of compensating degradation according to an exemplary embodiment includes: acquiring the luminance data from the panel assembly (S100), determining whether a pixel of the panel assembly is degraded based on the acquired luminance data (S300), and compensating the degraded pixel when there is the degraded pixel.

In addition, the acquiring of the luminance data from the panel assembly (S100) may measure luminance of light emitted from each pixel of the panel assembly to acquire the luminance data by the luminance measuring units.

In step S100, a luminance measuring unit may be formed at a side of a panel assembly as in the foregoing OLED display 100 shown in FIG. 1 or the luminance measuring unit may be formed on a bottom surface of the panel assembly as the OLED display 200 show in FIG. 3 so that luminance data can be acquired.

Whether a pixel of the panel assembly is degraded based on the acquired luminance data (S300) may be determined according to whether low-value luminance data are included in the luminance data.

The low-value luminance data from a plurality of pixel data measured by the luminance measuring unit 120 indicate that a specific pixel is degraded. Accordingly, whether the pixel of the panel assembly is degraded may be determined by analyzing a plurality of pixel data measured by the luminance measuring unit 120.

Next, as a step of compensating the degraded pixel, when there is the degraded pixel, the controller 133 controls a driving voltage ELVDD supplied to the pixel of the panel assembly (S500). In this case, the controller 133 may increase the driving voltage ELVDD supplied to the pixel so that the degraded pixel emits light as a normal pixel.

When a driving voltage ELVDD is supplied to the pixel of the panel assembly regardless of a red pixel, a green pixel, and a blue pixel, the controller 133 compensate the degraded pixel by controlling the driving voltage ELVDD.

When different driving voltages ELVDD_R, ELVDD_G, and ELVDD_B are supplied to the red pixel, the green pixel, and the blue pixel of the panel assembly, respectively, the controller 133 compensate the degraded pixel by controlling at least one of the driving voltages ELVDD_R, ELVDD_G, and ELVDD_B. In some exemplary implementations, when at least one of ELVDD_R, ELVDD_G, and ELVDD_B are supplied to the red pixel, the green pixel, and the blue pixel of the panel assembly, respectively, the controller 133 compensate the degraded pixel by controlling the driving voltages ELVDD_R, ELVDD_G, and ELVDD_B, respectively.

The method of compensating degradation according to another exemplary embodiment includes: acquiring the luminance data from the panel assembly (S100), determining whether a pixel of the panel assembly is degraded based on the acquired luminance data (S300), calculating a position of the degraded pixel based on the acquired luminance data (S400), and compensating the degraded pixel when there is the degraded pixel.

The acquiring the luminance data from the panel assembly (S100) and the determining whether a pixel of the panel assembly is degraded based on the acquired luminance data (S300) are the same as steps S100 and S300 in the method of compensating degradation according to an exemplary embodiment, and thus the detailed description thereof is omitted.

In the calculating of the position of a degraded pixel based on the acquired luminance data (S200), the position of the degraded pixel may be calculated from a position of a luminance measuring unit measuring luminance data having a relatively low value among the luminance data in a state that the same current is applied to respective pixels of the panel assembly. In step S20, the position of the degraded pixel may be calculated by the current measuring unit 134 and the pixel position calculator of the processing unit 130 shown in FIG. 2.

Meanwhile, unlike the above description, a current of the panel assembly may be indirectly calculated on an assumption that gray data are input to the panel assembly before the calculating of the position of a degraded pixel based on the acquired luminance data (S200) and the current has a substantially specific value when the gray data are output to the panel assembly. This method is a general method to measure the current of the panel assembly, and thus a detailed description thereof is omitted.

Further, the method of measuring and calculating the current applied to the panel assembly is not limited to the foregoing methods. The method of measuring and calculating the current applied to the panel assembly is not specially limited if the method measures the current of the panel assembly for measuring the position of the degraded pixel.

In the step of compensating the degraded pixel, the controller 133 controls the current of the degraded pixel so that the degraded pixel emits normal light similar as a normal pixel. That is, only a degraded pixel is individually compensated. In this case, the current of a pixel comprises a current supplied to a light emitting layer of the pixel.

The method of compensating degradation according to an exemplary embodiment compensates a pixel degradation by controlling a diving voltage ELVDD supplied to a plurality of pixels of the panel assembly when the pixels are degraded. In some other exemplary embodiments, the degradation is compensated by controlling only a current of a degraded pixel.

The foregoing method of compensating for degradation according to the exemplary embodiment was described in detail in the description of the OLED displays 100, 200, 300, 400, 500, and 600 according to the disclosed technology, and thus a detailed description thereof is omitted.

As described above, unlike other methods of compensating degradation according to the related art, a method of compensating degradation according to the exemplary embodiment measures a deterioration degree of luminance based on light emitted from an active pixel, which is arranged in a display region, other than a dummy pixel for compensating for the degraded pixel. In this manner, without using a dummy pixel, the method of compensating degradation according to the exemplary embodiment may measure and reflect luminance data directly from an actual active pixel to compensate for the degraded pixel and thereby significantly prevent a compensation error from occurring.

For purposes of summarizing the disclosed technology, certain aspects, advantages and novel features of the disclosed technology have been described herein. It is to be understood that not necessarily all such advantages may be achieved in accordance with any particular embodiment of the disclosed technology. Thus, the disclosed technology may be embodied or carried out in a manner that achieves or optimizes one advantage or group of advantages as taught herein without necessarily achieving other advantages as may be taught or suggested herein.

A detailed description of the accompanying drawings and the disclosed technology are only an embodiment, which are used for the purpose of describing the disclosed technology but are not used to limit the meanings or a range of the disclosed technology described in claims. Accordingly, those skilled in the art to which the disclosed technology pertains can easily select and substitute therefrom. Therefore, a substantial technical protective range of the disclosed technology will be determined based on a technical idea of appended claims.

What is claimed is:

1. An organic light emitting diode display comprising:
a panel assembly including a plurality of pixels;
a plurality of luminance measuring units formed along a perimeter surface of the panel assembly and configured to measure data indicative of luminance emitted from the pixels; and
a processing unit configured to compare luminance data so as to detect a degraded pixel and to compensate the luminance of the degraded pixel, wherein the processing unit further comprises:
a current measuring circuit configured to measure a current applied to the panel assembly;
a degradation determinator circuit configured to determine the degradation of a pixel by comparing the current measured by the current measuring unit with the current luminance data measured by the luminance measuring units; and
a controller circuit configured to compensate for the degradation of the pixel by increasing a current applied to the degraded pixel.

2. The organic light emitting diode display of claim 1, wherein each luminance measuring unit comprises a photo sensor.

3. The organic light emitting diode display of claim 1, wherein the luminance measuring units are formed at a predetermined interval along the perimeter surface.

4. The organic light emitting diode display of claim 1, wherein the processing unit further comprises a pixel position calculator circuit configured to determine a position of a degraded pixel from a position of at least one of the luminance measuring units, and wherein the at least one luminance measuring unit measures luminance data of a low value from among the luminance data measured by the luminance measuring units in a state that a same current is applied to the panel assembly.

5. An organic light emitting diode display comprising:
a panel assembly including a display area on which a plurality of pixels are formed and a non-display area on which a pixel is not formed;
a diffused reflection region formed in the non-display area of the panel assembly to diffuse a light emitted from the display area;
a plurality of luminance measuring units formed on a bottom surface of the panel assembly and configured to measure data indicative of luminance diffused from the diffused reflection unit; and
a processing unit configured to detect and compensate luminance of a degraded pixel, wherein the processing unit further comprises:
a current measuring circuit configured to measure a current applied to the panel assembly;
a degradation determinator circuit configured to determine whether a pixel is degraded by comparing the current measured by the current measuring unit with the current luminance data measured by the luminance measuring units; and
a controller circuit configured to compensate for the degradation of the pixel by increasing a current applied to the degraded pixel.

6. The organic light emitting diode display of claim 5, wherein the diffused reflection region is formed on a top surface of the panel assembly.

7. The organic light emitting diode display of claim 5, further comprising a refraction region formed between the diffused reflection region and the panel assembly.

8. The organic light emitting diode display of claim 5, wherein the top surface of the panel assembly is partially excavated, and wherein the diffused reflection region is formed in the excavated region.

9. The organic light emitting diode display of claim 8, wherein the thickness of the diffused reflection unit is same as a depth of the excavated region in the panel assembly.

10. The organic light emitting diode display of claim 5, wherein the diffused reflection region has a line shape.

11. The organic light emitting diode display of claim 5, wherein the diffused reflection region comprises diffused reflection parts formed in a predetermined interval.

12. The organic light emitting diode display of claim 5, wherein the luminance measuring units comprise a photo sensor.

13. The organic light emitting diode display of claim 5, wherein the luminance measuring units are formed at a predetermined interval along the perimeter surface.

14. The organic light emitting diode display of claim 5, wherein the luminance measuring units face the diffused reflection region.

15. The organic light emitting diode display of claim 5, wherein the processing unit further comprises a pixel position calculator circuit configured to determine a position of a degraded pixel from a position of at least one of the luminance measuring units, and wherein the at least one luminance measuring unit measures luminance data having a low value among the luminance data measured by the luminance measuring units in a state that a same current is applied to the panel assembly.

16. The organic light emitting diode display of claim 5, further comprising a light blocking unit formed on the diffused reflection region in the non-display area of the panel assembly.

17. The organic light emitting diode display of claim 16, wherein the light blocking unit comprises a black polarizing film.

18. A method of compensating a degraded pixel of an organic light emitting diode display, the method comprising:
   acquiring luminance data from a panel assembly of the organic light emitting diode display;
   determining whether a pixel of the panel assembly is degraded based on the acquired luminance data; and
   compensating a degraded pixel when there is the degraded pixel,
   wherein acquiring of the luminance data from a panel assembly comprises acquiring the luminance data by measuring luminance of light emitted from respective pixels of the panel assembly by a plurality of luminance measuring units,
   wherein determining whether a pixel of the panel assembly is degraded includes determining whether low-value luminance data are included in the luminance data,
   wherein compensating of the degraded pixel may include increasing a current applied to the degraded pixel.

19. The method of claim 18, further comprising calculating a position of the degraded pixel from the acquired luminance data before compensating the degraded pixel after determining whether the pixel is degraded.

20. The method of claim 19, wherein calculating of the position of the degraded pixel comprises calculating the position of the degraded pixel from a position of one of more luminance measuring units of the organic light emitting diode display, and wherein the luminance measuring units measure low-value luminance data when the current is applied to respective pixels of the panel assembly.

21. The method of claim 18, wherein compensating of the degraded pixel may include controlling a full driving voltage supplied to the pixel of the panel assembly.

22. The method of claim 18, wherein compensating of the degraded pixel comprises controlling a red driving voltage, a green driving voltage, and a blue driving voltage supplied to the pixel of the panel assembly.

* * * * *